United States Patent
Hampapur et al.

(10) Patent No.: US 10,414,416 B2
(45) Date of Patent: *Sep. 17, 2019

(54) ASSET FAILURE PREDICTION WITH LOCATION UNCERTAINTY

(71) Applicant: International Business Machines Corporation, Armonk, NY (US)

(72) Inventors: Arun Hampapur, Norwalk, CT (US); Hongfei Li, Briarcliff Manor, NY (US); Dhaivat P. Parikh, Plano, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 543 days.

This patent is subject to a terminal disclaimer.

(21) Appl. No.: 13/962,287

(22) Filed: Aug. 8, 2013

(65) Prior Publication Data

US 2014/0200829 A1 Jul. 17, 2014

Related U.S. Application Data

(63) Continuation of application No. 13/907,056, filed on May 31, 2013, now abandoned.

(Continued)

(51) Int. Cl.
*B61K 9/08* (2006.01)
*B61L 23/04* (2006.01)
(Continued)

(52) U.S. Cl.
CPC ............. *B61K 9/08* (2013.01); *B61L 23/042* (2013.01); *B61L 23/044* (2013.01);
(Continued)

(58) Field of Classification Search
CPC ............................ B61L 23/042; B61L 23/047
See application file for complete search history.

(56) References Cited

U.S. PATENT DOCUMENTS

| 3,381,626 A | 5/1968 | Fagan et al. |
| 3,500,186 A | 3/1970 | Smith et al. |

(Continued)

FOREIGN PATENT DOCUMENTS

| EP | 0982673 A2 | 3/2000 |
| WO | 2004076256 A1 | 9/2004 |

OTHER PUBLICATIONS

Larsson, Dan. A Study of the Track Degradation Process Related to Changes in Railway Traffic. Luleå University of Technology JvtC—Luleå Railway Research Centre Division of Operation and Maintenance Engineering 2004:48 | ISSN:1402-1757 | ISRN:LTU-LIC—04/48—SE.*

(Continued)

*Primary Examiner* — Michael J Dalbo
(74) *Attorney, Agent, or Firm* — Cantor Colburn LLP; Kevin Michael Jordan

(57) ABSTRACT

Geo-defect repair modeling with location uncertainty is provided. A method includes logically dividing a railroad network into segments each of a specified length. The method also includes identifying, via a computer processor, geo-defects and approximated locations of the geo-defects occurring at each inspection run for each of the segments. The method also includes calculating, via the computer processor, a rate of increase in amplitude of each of the geo-defects for each of the segments between inspection runs, determining a correlation of the geo-defects between the inspection runs as a function of the approximated locations, and predicting a deterioration rate for each of the geo-defects based on the calculating.

16 Claims, 11 Drawing Sheets

Related U.S. Application Data

(60) Provisional application No. 61/751,704, filed on Jan. 11, 2013.

(51) Int. Cl.
  *G06Q 10/06* (2012.01)
  *G06F 17/50* (2006.01)
  *B61L 27/00* (2006.01)

(52) U.S. Cl.
  CPC .......... *B61L 23/045* (2013.01); *B61L 23/047* (2013.01); *B61L 27/0055* (2013.01); *B61L 27/0088* (2013.01); *G06F 17/5009* (2013.01); *G06Q 10/06* (2013.01); *G06Q 10/0635* (2013.01)

(56) References Cited

U.S. PATENT DOCUMENTS

| | | | | |
|---|---|---|---|---|
| 4,173,073 | A * | 11/1979 | Fukazawa | G01C 15/00 104/7.2 |
| 4,793,047 | A | 12/1988 | Curtis et al. | |
| 5,020,007 | A | 5/1991 | Wu et al. | |
| 5,542,043 | A | 7/1996 | Cohen | |
| 5,774,629 | A | 6/1998 | Yamaguchi et al. | |
| 5,791,063 | A * | 8/1998 | Kesler | E01B 35/00 33/1 Q |
| 5,867,404 | A * | 2/1999 | Bryan | B61K 9/08 342/457 |
| 5,970,438 | A * | 10/1999 | Clark | B61K 9/08 702/184 |
| 5,986,547 | A | 11/1999 | Korver et al. | |
| 6,324,659 | B1 | 11/2001 | Pierro | |
| 6,347,265 | B1 | 2/2002 | Bidaud | |
| 6,804,621 | B1 * | 10/2004 | Pedanckar | E01B 37/00 702/85 |
| 7,164,975 | B2 | 1/2007 | Bidaud | |
| 2002/0059075 | A1 * | 5/2002 | Schick | B61L 27/0094 701/31.4 |
| 2003/0055666 | A1 | 3/2003 | Roddy et al. | |
| 2003/0136192 | A1 * | 7/2003 | Tu | G01N 29/12 73/587 |
| 2004/0122569 | A1 * | 6/2004 | Bidaud | B61K 9/08 701/19 |
| 2005/0021485 | A1 | 1/2005 | Nodelman | |
| 2006/0001547 | A1 | 1/2006 | Davenport | |
| 2006/0015224 | A1 | 1/2006 | Hileary | |
| 2007/0087756 | A1 | 4/2007 | Hoftberg | |
| 2007/0152107 | A1 | 7/2007 | Lefebvre | |
| 2007/0217670 | A1 * | 9/2007 | Bar-Am | B61K 9/08 382/141 |
| 2009/0043547 | A1 | 2/2009 | Kirby et al. | |
| 2009/0063115 | A1 | 3/2009 | Lu et al. | |
| 2009/0070064 | A1 * | 3/2009 | Farritor | B61K 9/08 702/150 |
| 2009/0110349 | A1 | 4/2009 | Nasle et al. | |
| 2009/0326746 | A1 | 12/2009 | Mian | |
| 2010/0004804 | A1 * | 1/2010 | Anderson | B61K 9/08 701/19 |
| 2010/0026551 | A1 * | 2/2010 | Szwilski | B61K 9/08 342/22 |
| 2010/0241639 | A1 | 9/2010 | Kifer et al. | |
| 2011/0238336 | A1 | 9/2011 | Di Scalea et al. | |
| 2012/0059684 | A1 | 3/2012 | Hampapur et al. | |
| 2012/0143796 | A1 | 6/2012 | Lazano | |
| 2012/0300060 | A1 * | 11/2012 | Farritor | B61K 9/08 348/125 |
| 2013/0231873 | A1 * | 9/2013 | Fraser | B61K 5/00 702/35 |

OTHER PUBLICATIONS

Ferreira. L. and Murray, M. (1997). Modelling rail track deterioration and maintenance: current practices and future needs. Transport Reviews, 17 (3), 207-221. Copyright 1997 Taylor & Francis.*

Zhao, Chan, Roberts, and Stirling. Railway Research Centre, The University of Birmingham, Birmingham, UK. Jan. 11, 2006. DOI: 10.1243/09544097JRRT30.*

Mohammadzadeh, A novel method to estimate derailment probability due to track geometric irregularities using reliability techniques and advanced simulation methods, Arch Appl Mech 81:1621-1637 (Year: 2011).*

U.S. Appl. No. 13/873,851; Non-Final Office Action; filed Apr. 30, 2013; dated Jun. 10, 2014; pp. 1-7.

U.S. Appl. No. 13/873,829; Non-Final Office Action, filed Apr. 30, 2013; dated Jan. 28, 2015; 15 pages.

U.S. Appl. No. 13/873,851, Notice of Allowance; filed Apr. 30, 2013; dated Mar. 16, 2015; 12 pages, Nov. 20, 2015.

U.S. Appl. No. 13/873,851; Final Office Action; filed Apr. 30, 2013; dated Jan. 2, 2015; 13 pages.

U.S. Appl. No. 13/962,203; Non-Final Office Action; filed Aug. 8, 2013; dated Jun. 3, 2015; 28 pages.

International Search Report and Written Opinion; International Application No. PCT/US2014/010628; International Filing date: Jan. 8, 2014; dated Aug. 13, 2014; 13 pages.

A. Bhattacharya, D. B, Dybsibm, "Sparse Bayesian Infinite factor models" 2011 Biometrica Trust, pp. 291-306.

Broomhead et al., "Multivariable Functional Interpolation and Adaptive Networks", Complex Systems Publication, Inc. 1988; 35 pages.

Hutchinson et al., "A Nonparametric Approach to Pricing and Hedging Derivative Securities Via Learning Networks," The Journal of Finance, vol. XLIX, No. 3, Jul. 1994; 40 pages.

P. Newbold, C. W. J. Granger, "Experience with Forecasting Univariate Time Series and the Combination of Forecasts" J. R. Statistical Society, (1974), pp. 131-165.

U.S. Appl. No. 13/873,829; Final Office Action; filed Apr. 30, 2013; dated Jul. 10, 2015; 43 pages.

U.S. Appl. No. 13/873,829; Non-Final Office Action, filed Apr. 30, 2015; dated Dec. 11, 2015; 54 pages.

U.S. Appl. No. 13/873,859; NonFinal Office Action, filed Apr. 3, 2013; dated Oct. 20, 2015; 20 pages.

U.S. Appl. No. 13/907,056, Non-Final Office Action, filed May 31, 2013; dated Nov. 20, 2015; 26 pages.

U.S. Appl. No. 13/962,203; Final Office Action; filed Aug. 8, 2013; dated Nov. 4, 2015; 51 pages.

U.S. Appl. No. 13/962,229; Non-Final Office Action, filed Aug. 8, 2013; dated Jan. 5, 2016; 23 pages.

U.S. Appl. No. 13/962,252; Non-Final Office Action, filed Aug. 8, 2013; dated Jan. 25, 2016; 47 pages.

U.S. Appl. No. 13/962,310; NonFinal Office Action, filed Aug. 8, 2013; dated Dec. 31, 2015; 31 pages.

Beichelt et al., General Failure Model Applied to Preventative Maintenance Policies, 1980, IEEE, pp. 39-41.

Berawi et al., Evaluating Track Geometrical Quality Through Different Methodologies, 2010, IJech 201, pp. 38-47.

Nielsen et al., Life Cycle managment of railway bridges—defect management, 2012, pp. 425-435.

Oyama et al., Mathematical Modeling Analyses for Obtaining an Optimal Railway Track Maintenance Schedule, 2006, pp. 207-224.

* cited by examiner

| Defect type | Intercept | Traffic (MGT) | Traffic (# of cars) | Traffic (# of trains) | Sequence # | Traffic speed |
|---|---|---|---|---|---|---|
| ALIGN | -7.71E+00 | -- | -- | -- | -- | -- |
| CANT | -7.66E+00 | -7.01E-02 | 6.05E-06 | 6.52E-04 | 6.71E-02 | -- |
| DIP | -7.58E+00 | 7.21E-02 | -- | -- | -- | -- |
| GAUGE_C | -8.53E+00 | 8.62E-02 | -- | -- | 1.13E-01 | -- |
| GAUGE_W1 | -7.42E+00 | 3.58E-02 | 4.64E-06 | -- | 7.02E-02 | -5.08E-01 |
| GAUGE_W2 | -8.08E+00 | 1.90E-02 | -- | 2.05E-04 | 7.98E-02 | -- |
| HARM_X | -7.44E+00 | -- | -- | -- | -- | -- |
| OVERELEV | -7.58E+00 | 2.45E-01 | -- | -- | 6.99E-02 | -- |
| REV_X | -7.40E+00 | -- | -- | -- | -- | -- |
| SUPER_X | -8.97E+00 | -- | -- | -- | -- | -- |
| SURF | -6.99E+00 | 2.00E-01 | -- | -1.33E-03 | 4.36E-02 | -- |
| WEAR | -8.22E+00 | 2.95E-02 | -- | 4.73E-04 | 7.49E-02 | -- |
| XLEVEL | -7.66E+00 | -- | 2.64E-06 | 3.23E-04 | 9.18E-02 | -- |

FIG. 5

| covariates | coef | exp (coef) (hazard ratio) | se(coef) | z | Pr(>\|z\|) |
|---|---|---|---|---|---|
| numCII_GAUGE_W1 | 1.01E-01 | 1.11E+00 | 1.96E-02 | 5.165 | 2.40E-07 |
| amp90_SUPER_X | 5.10E-01 | 1.67E+00 | 1.68E-01 | 3.028 | 0.00246 |
| amp90_GAUGE_C | 6.33E-01 | 1.88E+00 | 2.10E-01 | 3.013 | 0.00259 |
| numCII_REV_X | 6.66E-01 | 1.95E+00 | 3.21E-01 | 2.077 | 0.03782 |
| amp90_DIP | 9.58E-01 | 2.61E+00 | 4.67E-01 | 2.052 | 0.04016 |
| amp90_WARP | 7.44E-01 | 2.10E+00 | 3.69E-01 | 2.014 | 0.04404 |
| amp90_HARM_X | 5.43E+00 | 2.29E+02 | 2.78E+00 | 1.958 | 0.05028 |
| numcII_GAUGE_W2 | 2.28E-01 | 1.26E+00 | 1.17E-01 | 1.948 | 0.05139 |
| amp90_WEAR | 1.54E+00 | 4.65E+00 | 8.34E-01 | 1.843 | 0.06533 |
| amp90_ALIGN | 4.17E+00 | 6.45E+01 | 2.40E+00 | 1.736 | 0.08261 |

| Type | Notation | Description |
|---|---|---|
| Indices | $i \in I$ | Index for section in a line segment |
| | $j \in J$ | Index for defect category in the set of categories observed in section $i$ |
| | $k \in K$ | Index for individual Class II defect of type $j$ in section $i$ |
| | $a \in A$ | Index for chosen alternative out of all possible alternatives available to the decision maker |
| Decision variables | $x_a^i \; \forall i \in I, a \in A$ | Indicator which is 1 if alternative $a$ is chosen for section $i$, otherwise 0 |
| Parameters | $B$ | Budget for repair |
| | $C_D$ | Average derailment cost, assumed identical for all sections |
| | $C_I^i$ | Cost of repairing all existing Class I defects in section $i$ |
| | $C_{1a}^i \; \forall i \in I, a \in A$ | Cost of repairing all converted Class I defects from existing Class II defects if alternative $a$ is chosen for section $i$ |
| | $C_{2a}^i \; \forall i \in I, a \in A$ | Cost of repairing all Class II defects if alternative $a$ is chosen for section $i$ |
| | $P_a^i \; \forall i \in I, a \in A$ | Probability of a derailment in the time from this inspection run to the next, if alternative $a$ is chosen for section $i$ |
| | $P_a^i \; \forall k \in K, a \in A$ | Probability that Class II defect $k$ will progress to a Class I defect if alternative $a$ is chosen |
| | $C_{1a}^j \; \forall j \in J, a \in A$ | Cost of repairing $a$ Class I defect of category $j$ when alternative $a$ is chosen |

FIG. 9

ASSET FAILURE PREDICTION WITH LOCATION UNCERTAINTY

CROSS-REFERENCE TO RELATED APPLICATION

The present application is a Continuation application of U.S. patent application Ser. No. 13/907,056, filed on May 31, 2013, which claims the benefit of U.S. Patent Application Ser. No. 61/751,704 filed on Jan. 11, 2013, which are hereby incorporated by reference herein in their entirety.

BACKGROUND

In the United States, railroads represent a significant mode of transportation for moving freight. Thus, proper maintenance of the railway lines through repair and renewal is important for railroad operation and safety.

Track maintenance activities can be categorized into two groups: preventive maintenance and corrective maintenance. Preventive maintenance is pre-planned and carried out to avoid future defects, whereas corrective maintenance repairs existing defects in the infrastructure. Track repair is usually performed by a local track master in the network, and it is typically conducted on demand. Although corrective maintenance occurs on a relatively small scale as compared to preventive maintenance, it is important to repair severe track defects because they may lead to catastrophic train derailments.

SUMMARY

According to one embodiment of the present invention, a method is provided. The method includes logically dividing a railroad network into segments each of a specified length. The method also includes identifying, via a computer processor, geo-defects, and approximated locations of the geo-defects, occurring at each inspection run for each of the segments. The method further includes calculating, via the computer processor, a rate of increase in amplitude of each of the geo-defects for each of the segments between inspection runs, determining a correlation of the geo-defects between the inspection runs as a function of the approximated locations, and predicting a deterioration rate for each of the geo-defects based on the calculating.

According to another embodiment of the present invention, a system is provided. The system includes a computer processing system and an application executable by the computer processing system. The application is configured to implement a method. The method includes logically dividing a railroad network into segments each of a specified length. The method also includes identifying geo-defects, and approximated locations of the geo-defects occurring at each inspection run for each of the segments. The method further includes calculating a rate of increase in amplitude of each of the geo-defects for each of the segments between inspection runs, determining a correlation of the geo-defects between the inspection runs as a function of the approximated locations, and predicting a deterioration rate for each of the geo-defects based on the calculating.

According to a further embodiment of the present invention, a computer program product is provided. The computer program product includes a storage medium embodied with machine-readable program instructions, which when executed by a computer causes the computer to implement a method. The method includes logically dividing a railroad network into segments each of a specified length. The method also includes identifying geo-defects, and approximated locations of the geo-defects, occurring at each inspection run for each of the segments. The method further includes calculating a rate of increase in amplitude of each of the geo-defects for each of the segments between inspection runs, determining a correlation of the geo-defects between the inspection runs as a function of the approximated locations, and predicting a deterioration rate for each of the geo-defects based on the calculating.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 5 depicts a table including sample data representing estimation results of a track deterioration model in accordance with an embodiment of the present invention;

FIG. 9 is a table of model parameters used in optimization formulations in accordance with an embodiment of the present invention;

DETAILED DESCRIPTION

Figure 1:
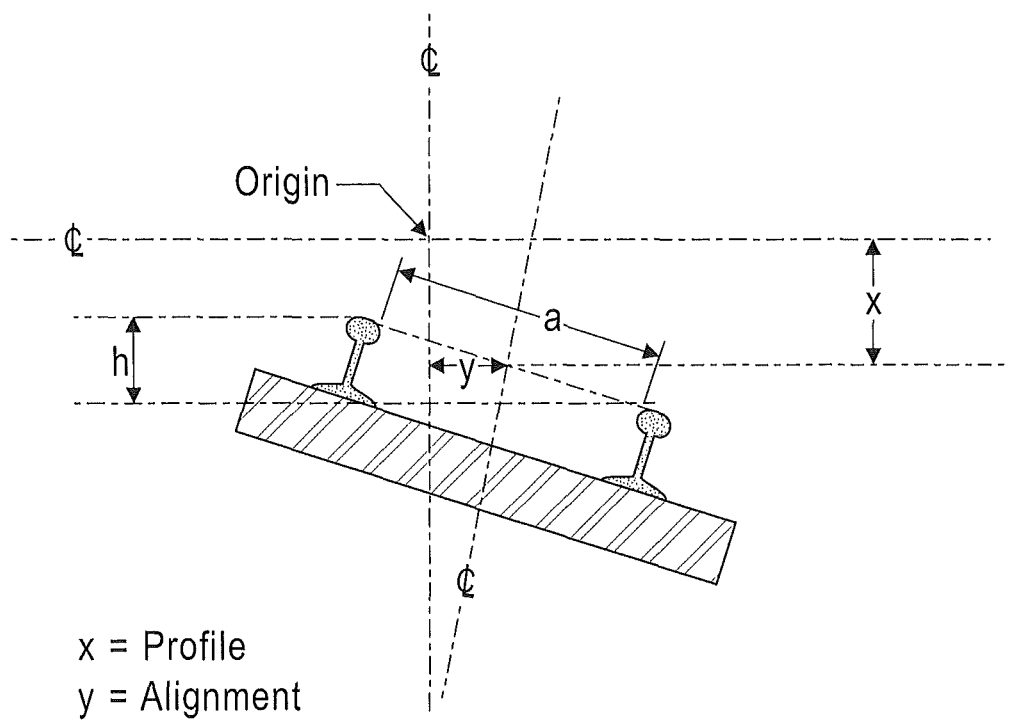
FIG. 1 is a graphical depiction of track geometry parameters in accordance with an embodiment of the present invention.

Track defects have become a leading cause of train accidents in the United States. These defects may be categorized into one of two groups: track structural defects and track geometry defects. Track structural defects are generated from the structural conditions of the track, which include the condition of the rail, sleeper, fastening systems, subgrade and drainage systems. On the other hand, track geometry defects (also referred to herein as geo-defects indicate severe ill-conditioned geometry parameters such as profile, alignment, gauge, cant and twist, as shown in FIG. 1.

In determining track deterioration, track segments may be divided into several shorter sections for analyzing summary statistics of raw geometry measurements. The overall statistics provide a measure of segment quality, called Track Quality Indices (TQIs. TQIs may be used for preventive maintenance scheduling, since they provide a high level assessment of railway track performance; however, they are not able to identify individual severe geo-defects for track repair. According to the US Federal Railroad Administration (FRA track safety standards, individual defects whose amplitudes exceed a certain tolerance level must be treated. Traditionally, geometry cars generally classify each defect by its severity as either Class I or Class II. Class I defects are those in violation of the FRA track safety standards, and railroads must fix these defects within a certain time period after their discovery or else they risk being fined. Class II defects are those whose amplitudes are currently below FRA limits, and they may or may not meet the particular railroad's own standards for repair. According to current practice, railroads fix Class I geo-defects almost immediately after inspection and they examine the Class II defects, repairing them based on their field experience. Hence, in order to make track repair decisions, it is desirable for existing railroads to address the following three questions: (1 how Class II geo-defects deteriorate into Class I defects; (2 how Class II geo-defects affect derailment risk; and (3 how to repair geo-defects within a budget. The following geo-defects are described below:

ALIGN. Align is the average of the left and right of a chord alignment.

CANT. Rail cant (angle measures the amount of vertical deviation between two flat rails from their designated value (e.g., one degree is approximately equal to ⅛" for all rail weights.

DIP. Dip is the largest change in elevation of the centerline of the track within a certain distance moving window. The dip may represent either a depression or a hump in the track and approximates the profile of the centerline of the track.

GAUGE_C. Gauge change is the difference in two gauge readings up to a specified distance.

GAUGE_TGHT. GAUGE_TGHT measures how much tighter the gauge is from a standard (e.g., a standard gauge of 56½".

GAUGE_W1. GAUGE_W1 is the distance between right and left rail measured ⅝" below the railhead.

GAGE_WIDE. GAUGE_WIDE reflects how much wider the gauge is from a standard (e.g., a standard 56½". The amplitude of the GAUGE_WIDE plus 56½" is equal to the actual track gauge reading.

GAUGE_W2. GAUGE_W2 is similar to GAUGE_W1 except it applies to concrete.

HARM_X. Harmonic cross-level defect refers to two cross-level deviations that are a certain distance apart in a curve.

OVERELEV. Over-elevation occurs when there is an excessive amount of elevation in a curve (overbalance based on the degree of curvature and the board track speed.

REV_X. Reverse cross-level occurs when the right rail is low in a left-hand curve or the left rail is low in a right-hand curve.

SUPER_X. Super cross-level, elevation or super-elevation measured at a single point in a curve.

SURF. Uniformity of rail surface measured in short distances along the tread of the rails. Rail surface is measured over a 62-foot chord, the same chord length as the FRA specification.

TWIST. Twist is the difference between two cross-level measurements a certain distance apart.

WARP. Warp is the difference between two cross-level or elevation measurements up to a certain distance apart.

WEAR. The Automated Rail Weight Identification System (ARWIS identifies the rail weight while the car is testing and measures the amount of head loss. The system measures for vertical head wear (VHW and gauge face wear (GFW per rail.

XLEVEL. Cross-level is the difference in elevation between the top surfaces of the rails at a single point in a tangent track segment.

The exemplary geo-defect repair modeling processes provide a framework for making optimal track geo-defect repair decisions, in order to appropriately reduce the probability of a derailment as well as its associated costs. Additionally, prioritized track geometry maintenance reduces dynamic vehicle and track interaction, thus reducing the stress state of the railroad. The exemplary geo-defect repair modeling processes and analytical framework for geo-defect repair minimizes total expected costs, which include potential derailment costs and repair costs. The geo-defect repair modeling processes formulate and integrate three models: a track deterioration model, a survival model, and an optimization model. The track deterioration model is used to study the degradation of Class II geo-defects' amplitudes, the survival model is used to assess the derailment risk as a function of the track condition, and the optimization model is used to optimize track repair decisions.

The geo-defect repair modeling processes also include a feature that enables geo-defect identification when there is uncertainty of the physical location of the geo-defects within the railroad network. Geo-defect location uncertainty can be caused by measurement or operation errors. Location uncertainty indicates a situation whereby an inspector who is evaluating measurements of a defect and its changes over time through inspections, is unsure or unable to determine if an identified defect is in fact the same defect previously determined because the location identifier (e.g., GPS coordinates of those two defects are not identical, e.g., based on some skew in the data collected.

Figure 2:
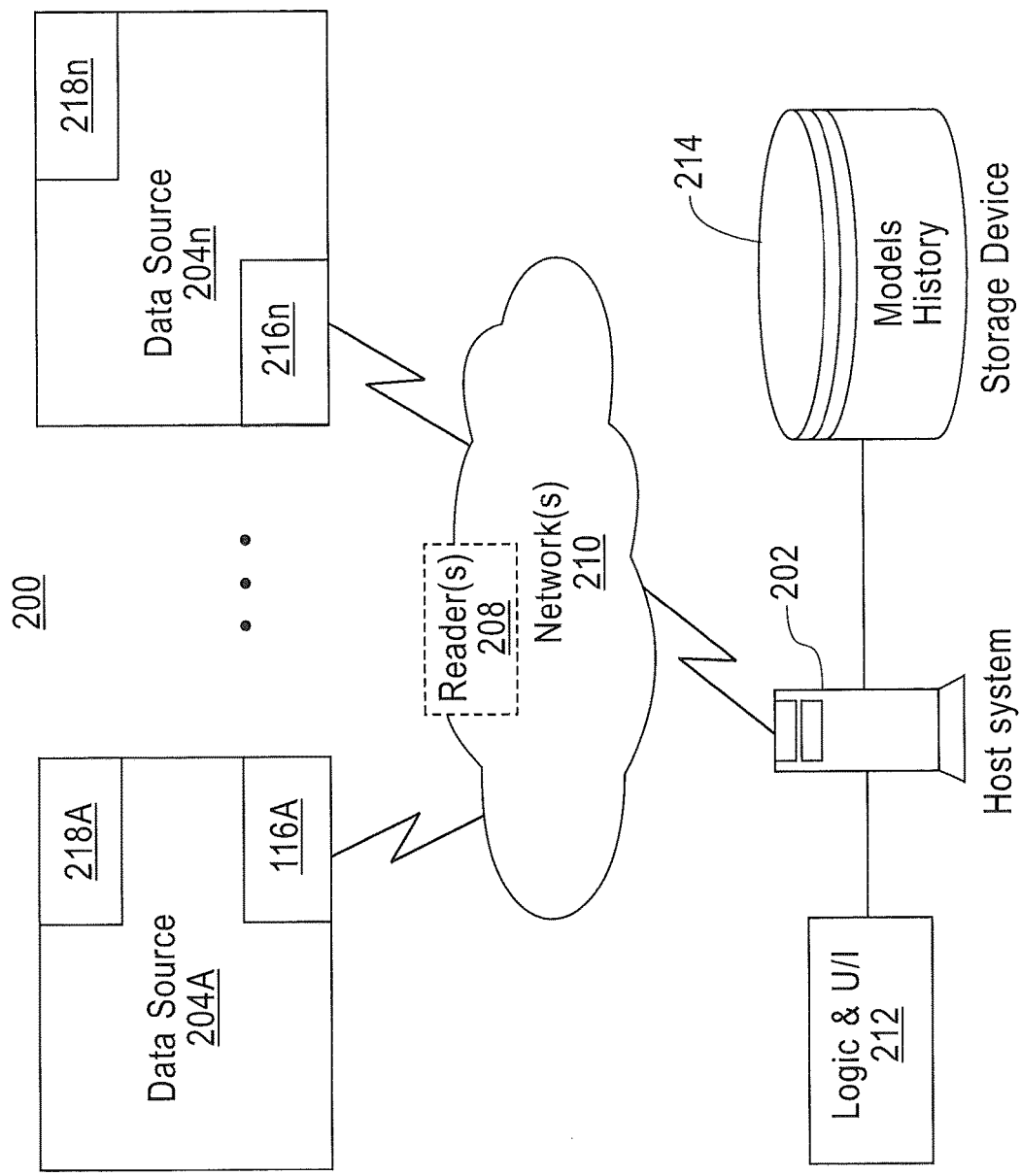
FIG. 2 depicts a block diagram of a system upon which geo-defect repair modeling processes for asset management and repair may be implemented according to an embodiment of the present invention.

Turning now to FIG. 2, a system 200 upon which the geo-defect repair modeling processes may be implemented will now be described in an exemplary embodiment. The system 200 of FIG. 2 includes a host system 202 in communication with data sources 204A-204n (referred to collectively as data sources 204 over one or more networks 210.

The host system 202 may be implemented as a high-speed computer processing device (e.g., a mainframe computer that is capable of handling a large volume of data received from the data sources 204. The host system 202 may be implemented by any entity that collects and processes a large amount of data from a multitude of data sources 204 to manage, or may be offered as a service to such entity by, e.g., an application service provider (ASP.

The data sources 204 may include devices configured to capture raw data from aspects of the asset, as well as any conditions surrounding the asset. In the railroad industry, for example, assets may be railroad tracks, as well as cars that travel along the tracks (and their constituent parts. The data sources 204 may include detectors, such as probes, sensors, and other instrumentation that are configured to measure qualitative aspects of the assets or surrounding conditions, such as temperature, weight or load, strain, dimensions (e.g., indications of wear, sound, and images, to name a few. In the railroad industry, the measurements may be taken with regard to railroad track components and vehicle wheels. In this embodiment, detectors that may be used as sources of data include machine vision detectors (MVDs, wheel impact load detectors (WILDS, optical geometry detectors (OCDs, truck performance detectors (TPDs, acoustic bay detectors (ABDs, hot box detectors, warm bearing detectors, and hot wheel/cold wheel detectors. In addition to the qualitative aspects, the data sources 104 may capture time, physical location, object location, and other information regarding the subject of measurement, as will be described herein. In this regard, the data sources 104 reflect multi-dimensional detection devices, as they are configured to collect a wide variety of different types of information.

The data sources 204A-204n may include (or may be coupled to corresponding communication components 216A-216n (referred to collectively as communication components 216 for transmitting captured data over one or more networks. In an embodiment, the communication components 216 may include, e.g., transceivers, antennae, and/or network cards for receiving and conveying data using wireless and/or wireline transmission technologies including radio frequency (RF, WiFi, Bluetooth, cellular, satellite, copper wiring, co-axial cabling, etc. For example, a probe on one of the data sources 204 collects data from a location (e.g., a location on a railroad track and transfers the data to the corresponding communication component 216 for transmission over networks 210 to the host system 202. In an embodiment, as shown in FIG. 2, the networks 210 may include one or more reader devices 208 for receiving the data from the data sources 204. In the railroad industry, e.g., the reader devices 208 may be RF readers positioned at defined locations (e.g., at fixed-length intervals along the railroad track. The RF readers 208 read data from corresponding data sources 204 (via the communication components 216, which may be RF antennae as the data sources 204 (embedded in the vehicles pass within communicative range of the reader devices 208.

In an embodiment, the data captured by the data sources 204 may be transmitted as raw data to the host system 202 or may be processed prior to transmission. The data sources 204A-204n may also include corresponding computer processors 218A-218n (collectively referred to as computer processors 218 for processing the raw data and/or formatting the data for transmission over the networks 210. Alternatively, if the data sources 204 do not include a computer processor, the captured data may be transmitted via the communication components 216 to a computer processor configured for receiving the data.

In another embodiment, some of the data sources 204 may alternatively include other information sources, such as cameras or portable communication devices (e.g., cellular telephones, smart phones, or other portable devices operated by users who are in direct observation of the asset or surrounding conditions who have observed an event that may have an impact on safety. The data collected by the host system 202 from these portable devices may include texts, images, messages, or other information provided by a user of a communication device. For example, an observer near a railroad track may witness a previously unreported defect or anomaly, record an image of the defect, and transmit the image with date/time information, and alternatively a text description, to the host system 202 or another entity which forwards the information to the host system 202.

The networks 210 may include any type of networks, such as local area networks, wide area networks, virtual private networks, and the Internet. In addition, the networks 210 may be configured to support wireless communications, e.g., via radio frequency (RF communications, cellular networks, satellite networks, and global positioning (GPS systems.

The host system 202 executes logic 212 for implementing the exemplary geo-defect repair modeling processes, as well as other processes, as described herein. The logic 212 includes a user interface component for enabling authorized users to set preferences used in configuring data sources 204 employed in the processes described herein, as well as generating and executing models, performing analysis on the histories of previously implemented models, and facilitating the generation of new models, or evolvement of existing models, to increase the ability for the managing entity to ensure reliable operation. The preferences may include designating a frequency of data collection by the data sources 204. The logic 212 may also be configured to utilize the information acquired from execution of the models to analyze and adopt repair plans for components of the asset. These, and other features of the predictive modeling, will be described further herein.

The host system 202 is communicatively coupled to a storage device 214 that stores various data used in implementing the geo-defect repair modeling processes. For example, the storage device 214 may store models, historical operational and measurement data, repair histories, etc., and other information desired. The storage device 214 may be directly in communication with the host system 202 (e.g., via cabling or may be logically addressable by the host system 202, e.g., as a consolidated data source over one or more networks 210.

Models are generated from history data collected from the data sources 204. Patterns of data from the measurements and resulting repair work can be used in a predictive manner for estimating when repair work should be performed and which conditions indicate priority scheduling of repair work. In addition, as new data is received, the models can be updated to reflect any changes discovered. A user interface of the logic 212 may be used to present organized history data, as well as other information. The created model may be stored as one of several stored models, e.g., in the storage device 214 of FIG. 2. As new data is received from the data sources 204, it can be applied to the models and may be used to update the models in order to ascertain future repair needs or critical issues that require immediate attention.

Data Summary and Pre-Processing

Figure 3:
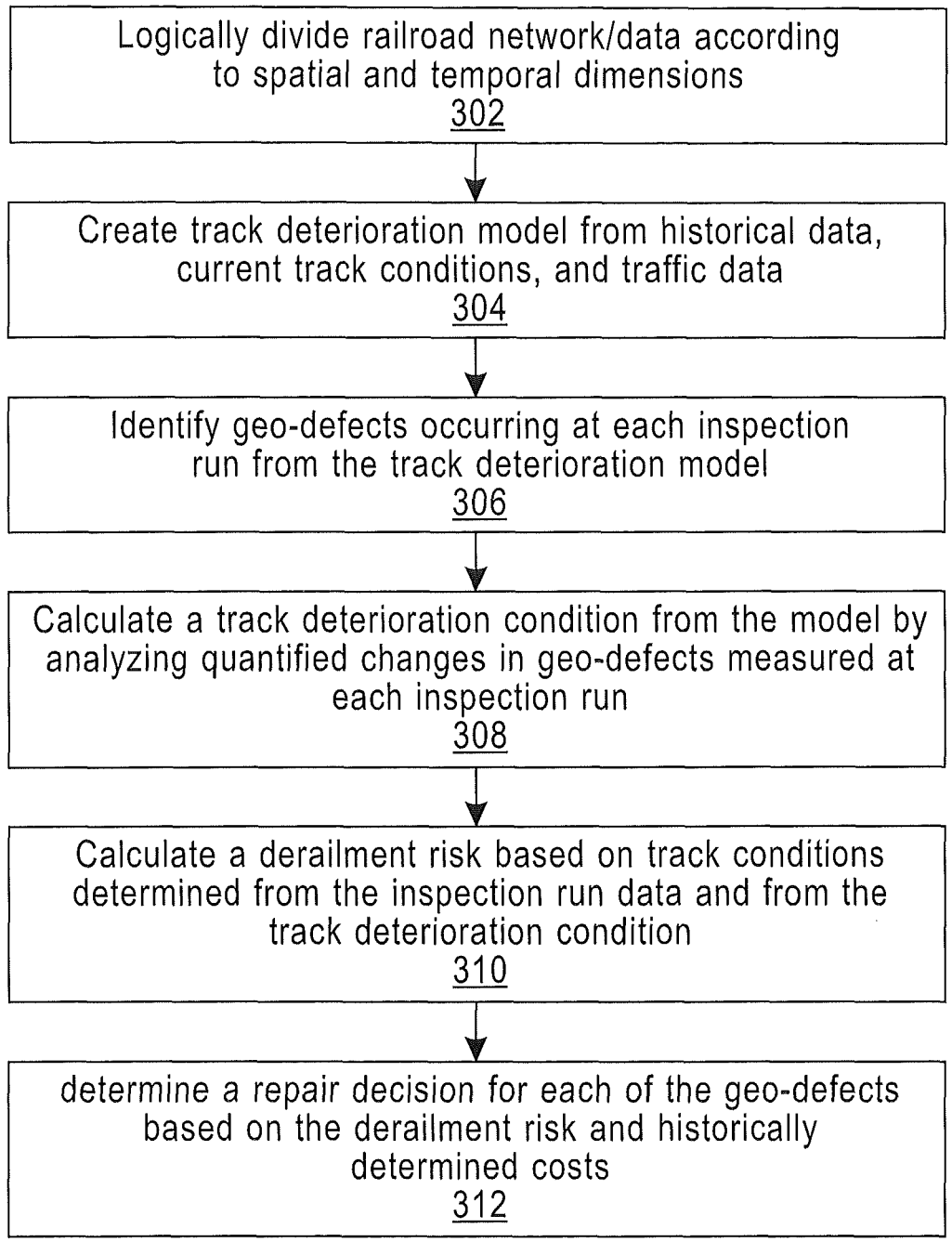
FIG. 3 depicts a flow diagram describing a process for implementing geo-defect repair modeling processes for asset management and repair according to an embodiment of the present invention.

A flow diagram describing a process for implementing the geo-defect repair modeling processes will now be described in an embodiment. The process of FIG. 3 assumes that a user of the geo-defect repair modeling processes accesses the application 212 of the host system 202 and requests data from the storage device 214, whereby the storage device 214 stores data from a railroad network as described in FIG. 2.

The geo-defect repair modeling processes utilizes field datasets from the existing railroad network, e.g., including traffic data, derailment data, and geo-defect data over a defined period of time (e.g., 3 years. Since main line tracks typically carry most of the traffic, and derailments associated with these tracks usually cost much more than other track types, the analysis may focus on several hundreds or thousands of miles of main line tracks. The datasets may include the historical data received from the data sources 204 and stored in the storage device 214 of FIG. 2.

At step 302, the railroad network and associated datasets are logically divided and processed along both spatial and temporal dimensions. In particular, spatially, the rail network is defined by line segments (e.g., segments connecting two cities, track numbers (0-8 for main line tracks, and mile post locations. Constructed in such a fashion, the rail lines may range from a few miles to hundreds of miles. To generate consistent spatial units and accommodate different modeling purposes, the main line network may be further divided into two different levels of smaller segments, called lots and sections. At the finer level of granularity, each lot may be 0.02 mile (about 100 ft in length, used for track deterioration analysis. At a higher level, a continuous track segment may be divided into two-mile long sections, used for track derailment risk as well as geo-defect repair modeling.

In terms of processing the datasets along temporal dimensions, regular track geometry inspection may be performed several times per year (e.g., 3 to 6 times per year according to the characteristics of each track segment. Geo-defects may be identified, reported, and updated after each inspection run. When they occur in the same inspection run window, different types of geo-defects are aggregated to the level of an inspection run.

The Track Deterioration Model

At step 304, the geo-defect repair modeling processes, via the application 112, develop a track deterioration model to represent the causes and consequences of track deterioration. At step 306, geo-defects are identified from the datasets according to the spatial and temporal dimensions. The model takes various factors into account, including the current track conditions and traffic information, and it has the capability to predict future track conditions. Track deterioration may be captured by studying geo-defect amplitude changes, measured at each geometry inspection.

The model constructs the relationships between the effective parameters and the track deterioration rate, while incorporating the uncertainty caused by the unknown factors and measurement noise. By developing the model, the geo-defect repair modeling processes are able to predict the deterioration of each geo-defect and the risk of a Class II geo-defect becoming Class I in the future.

To model track deterioration, the geo-defect repair modeling processes track the evolution of track defects. However, due to the lack of geo-defect indices, it may not be possible to track any particular geo-defect over time. This situation may be resolved by tracking the condition of small track segments, where each segment contains very few geo-defects for each inspection run. In particular, the tracks are divided into non-overlapping lots of equal length of 0.02 miles, (i.e., 105.6 feet. Historically, ninety percent of geo-defect lengths are shorter than 100 feet and about fifty percent of geo-defect lengths are about 30-40 feet. The defects are then aggregated by inspection run for each defect type. The 90 percentile of the amplitude may be used to represent the track segment condition for the inspection run under consideration; however, other percentile measurements may be used if desired.

The data analysis includes fitting different models for different defect types, since the model parameters having varying effects on deterioration rate for each defect type. This analysis assumes that geo-defects typically worsen over time (e.g., defect amplitudes increase when there is no maintenance work. For each defect type, let $y_k(t$ denote the aggregated geo-defect amplitude (e.g., the 90 percentile of the defect amplitudes of the track segment k at inspection time t. The deterioration rate or the amplitude change rate over time $\Delta t$ can be represented as $(y_k(t+\Delta t)-y_k(t/\Delta t$.

The deterioration rate may be expressed as:

$$\log\left(\frac{y_k(t+\Delta t) - y_k(t)}{\Delta t y_k(t)}\right) = \alpha_0 + \alpha_1 X_{1k}(t) + \ldots + \alpha_p X_{pk}(t) + \varepsilon_k(t)$$

Based on the data analysis, an exponential relationship between the external factors $X_{1k}(t, \ldots, X_{pk}(t$ and the deterioration rate may be used in the model. It is assumed that the deterioration rate is linearly related with the current track condition. The random error, $\varepsilon_k(t$, is assumed normally distributed with mean equal to 0 and standard deviation $\sigma^2$.

Figure 4A:
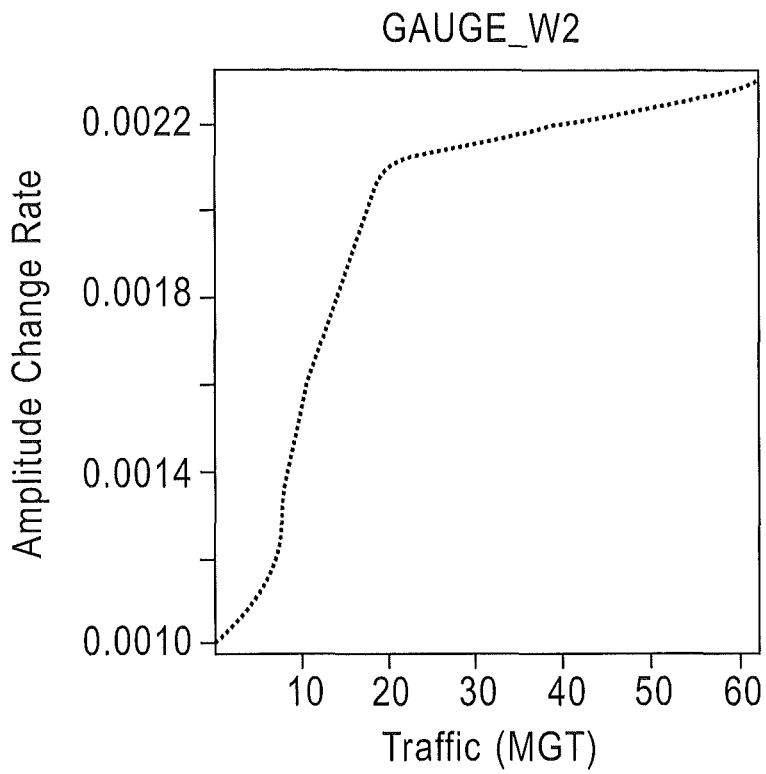
FIGS. 4A-4B are graphical depictions of geo-defect amplitude change rates for two defect types from results of implementing geo-defect repair modeling processes in accordance with an embodiment of the present invention.
Figure 4B:
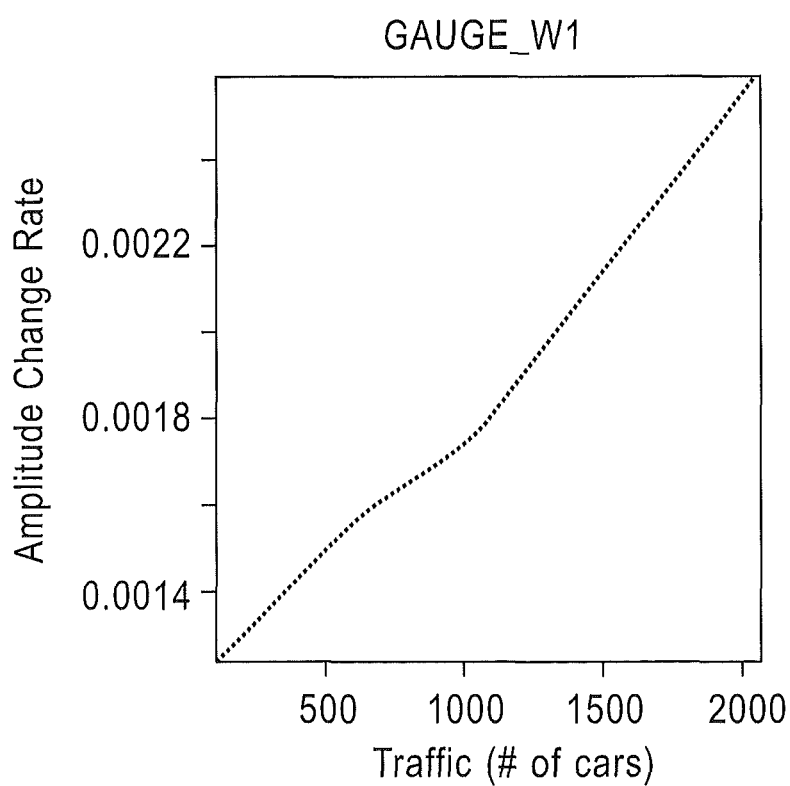

The factors considered in the model include monthly traffic MGT, monthly total number of trains, number of geo-defects of one particular type in one inspection run, and the duration of the Class II geo-defect before it becomes Class I. Model fitting reflects that factors have different impacts on deterioration rates for each defect type. The coefficients, $\alpha_1, \ldots, \alpha_p$, are listed in a table 400, as estimation results of the track deterioration model, as shown in FIG. 4.

At step 308, the probability of a Class II geo-defect becoming Class I at some future time is computed. To compute the probability of a Class II defect becoming Class I in the future, the defect amplitude for the next inspection run is predicted, and is shown with the actual amplitude in FIG. 4. For purposes of illustration let $\Delta t=90$ days. Assuming the threshold for of a Class II defect becoming a Class I for a certain defect type is r, define:

$$h_k(t) = \log\left(\frac{r - y_k(t)}{\Delta t y_k(t)}\right),$$

$$z = \log\left(\frac{y_k(t+\Delta t) - y_k(t)}{\Delta t y_k(t)}\right)$$

where z is normally distributed. The risk, $p_k(t$, of a Class II geo-defect at time t on track segment k becoming Class I in $\Delta t$ is:

$$p_k(t) = \int_{h_k(t)}^{\infty} z \, dz$$

The Track Derailment Risk Model

Survival analysis is used to describe the analysis of data regarding the occurrence of a particular event, within a time period after a well-defined time origin. Analyzing survival times may be used in areas, such as biomedical computation, engineering, and the social sciences.

In the railway application described herein, each inspection run may "refresh" the track segment data since all Class I geo-defects will be repaired. If there is no derailment between two scheduled inspection runs on a track segment, the track can be considered to have "survived" from one inspection to the next. If any derailment occurs, the track segment is said to have "failed" in the time period since the last inspection run.

Associated with the survival of a track section at a point in time, the derailment on this track section is referred to as a hazard. In survival theory, there are three basic functions: the density function f(t, survival function S(t, and hazard function λ(t. For a derailment, the density function f(t expresses the likelihood that the derailment will occur at time t. The survival function represents the probability that the track section will survive until time t:

$$S(t) = Prob(T \geq t) = \int_t^\infty f(x)dx = 1 - \int_0^t f(x)dx = 1 - F(t)$$

where T denotes the variable of survival time of a track segment after inspection, and F(t denotes the cumulative function of variable T. The hazard function is the likelihood that a derailment takes place in time t given that it has lasted at least until t. By definition, the relationship between these three functions may be expressed as:

$$\lambda(t) = \frac{f(t)}{S(t)} = -\frac{d\ln S(t)}{dt}$$

$$S(t) = \exp\left[-\int_0^t \lambda(x)dt\right]$$

$$f(t) = \lambda(t)S(t) = \lambda(t)\exp\left[-\int_0^t \lambda(x)dx\right]$$

The hazard function represents the instantaneous rate of failure probability at time t, given the condition that the event survived to time t. Parametric models may be used to specify the density distribution f(t, such as exponential, Weibull, log-logistic, and log-normal distributions; however, such pre-defined distributions may not appropriately fit real world data. Without having to specify any assumptions about the shape of the baseline function, a method for estimating the coefficients of covariates in the model using the method of partial likelihood (PL rather than maximum likelihood is desired, such as a Cox model. The Cox model is sometimes referred to as a semi-parametric model, and it assumes that the covariates multiplicatively shift the baseline hazard function. The Cox model, unlike the parametric approaches, does not need an assumption about the baseline hazard function. Furthermore, unlike non-parametric analysis such as the Kaplan-Meire method and the rank test, the Cox model allows both nominal and continuous variables. The hazard function form of Cox model may be expressed as:

$$\lambda(t; \beta, X) = \lambda_0(t)e^{\beta'X}$$

where λ0(t is an unspecified nonnegative function of time called the baseline hazard, and β is a columnvector of coefficients to be estimated, and $\beta'X = \beta_0 + \beta_1 x_1 + \beta_2 x_2 + \ldots + \beta_k x_k$. Because the hazard ratio for two subjects with fixed covariate vectors $X_i$ and $X_j$, $$\frac{\lambda_i(t)}{\lambda_j(t)} = \frac{\lambda_0(t)e^{\beta'X_i}}{\lambda_0(t)e^{\beta'X_j}},$$

is constant over time, the model is also known as the proportional hazards (PH model. In order to estimate β, Cox proposes a conditional (or partial likelihood function which depends only on the parameter of interest. The partial likelihood function is described as:

$$L_p(\beta) = \prod_{i=1}^n \left[\frac{e^{\beta'X_i}}{\sum_{j \in R(t_{(i)})} e^{\beta'X_j}}\right]^{\delta_i}$$

The maximum partial likelihood estimator may be determined by solving t the following equation:

$$\frac{\partial \ln(L_p(\beta))}{\partial \beta} = 0$$

Figure 6:
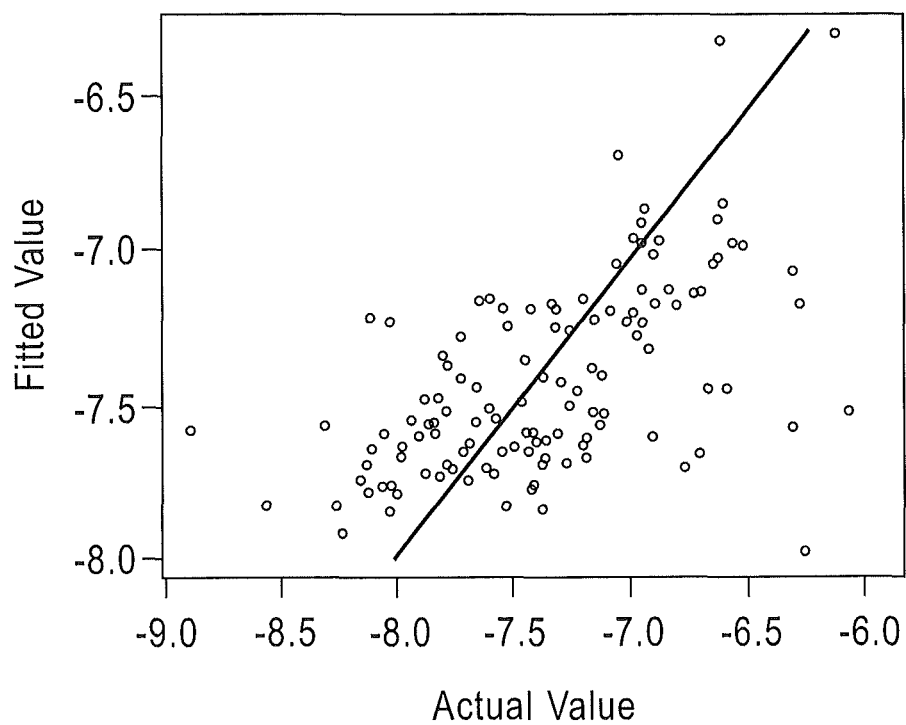
FIG. 6 is a graphical depiction of predicted versus actual geo-defect amplitudes in accordance with an embodiment of the present invention.
Figures 7, 8:
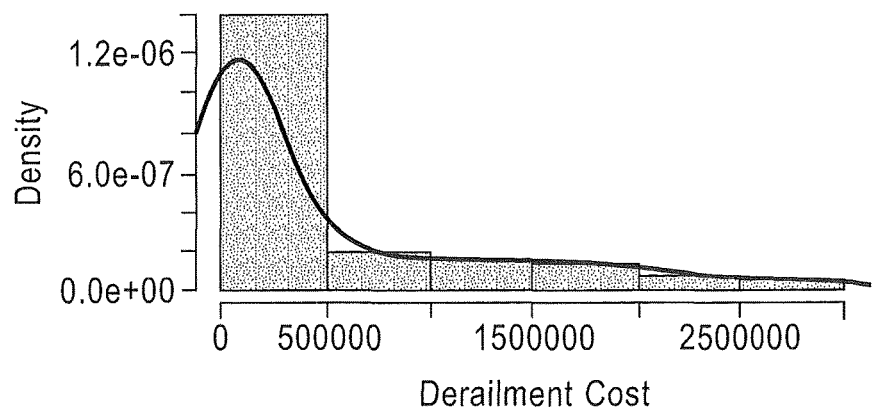
FIG. 7 depicts a table of estimation results of a Cox proportional hazards model in accordance with an embodiment of the invention.
FIG. 8 is a graphical depiction of sample probability density data for derailment costs in accordance with an embodiment of the present invention.

Fitting a Cox model may be implemented using existing statistical software. As described above, the raw geo-defects are spatially aggregated to the section level (e.g., 2 miles, and temporally into each inspection level. In one aggregated record, e.g., as shown in FIG. 6, the dependent variable is either the time duration between two inspection runs (censored survival time, or time duration between the derailment and the last inspection run before derailment. Selected candidate predictors may include monthly traffic in MGT, number of Class II geo-defects (starting with "numCII" in each defect category, and 90 percentile amplitude (starting with "amp90" of Class II geo-defects in each defect category.

The final Cox model fit to the censoring derailment data is illustrated in FIG. 6. One efficient way to evaluate the fitted model is to use Cox-Snell residuals. If the model is calibrated correctly, the Cox-Snell residuals should show a standard exponential distribution with hazard function equal to one, and thus the cumulative hazard of the Cox-Snell residuals should follow a straight 45 degree line.

The model shown in FIG. 6 includes ten covariates. Each significant covariate represents a particular geo-defect type. To further explain the covariate, a positive coefficient means that the hazard is higher (hazard ratio is greater than 1.0, whereas a negative one indicates a lower hazard (hazard ratio is less than 1.0. In the fitted model, all the covariates have positive coefficients, indicating that all geo-defect types listed in FIG. 6 have a strong positive impact on derailment risk. Those 10 significant geo-defect types can be categorized into two groups: the number based and amplitude based groups. On one hand, the number based group consists of GAUGE_W1, REV_X and GAUGE_W2, in which the number of geo-defect in a track section determines the derailment risk. On the other hand, the amplitude based group includes SUPER_X, GAUGE_C, DIP, WARP, HARM_X, WEAR, and ALIGN, and the 90 percentile of geo-defect amplitudes plays an important role to influence track geometry induced derailment.

Therefore, the derailment probability, $P_i$(t, on section i prior to time t can be derived at step 310 from:

$$P_i(t = Prob_i(T \leq t = 1 - S_i(t$$

where $S_i$(t indicates the survival probability on section i prior to time t. Furthermore, the derailment probability after repair alternative a is taken, $P_i$(t, a, can also be calculated in similar fashion:

$$P_i(t,a = 1 - (t,a$$

where $S_i(t, a$ is the survival probability after repair action a is performed on section i prior to time t.

Optimal Track Repair

As described above, two models have been provided: one to predict deterioration of Class II defects into Class I defects, and another to predict track-based derailments of trains. The results of these two models may be used, along with information regarding costs, as inputs for an optimization model under uncertainty at step 312.

According to FRA regulations, all Class I defects have to be repaired as soon as possible; however, determining which Class II defects should be repaired by the railways company can be challenging. There are costs associated with repairing Class II defects, but doing so may decrease the probability of derailment, which in turn would decrease expected derailment costs. It may be particularly prudential to repair Class II geo-defects that are likely to soon become Class I defects, since they will have to be repaired in the future anyway. The decision maker in such situations is usually the local track master, who may be in charge of several sections along a line segment. For instance, the track master may be responsible for track repair decisions for 50 miles of track, e.g., 25 sections of 2 miles each.

The track repair optimization processes will now be described. The track optimization processes of the geo-defect repair modeling processes use a simple single-stage model and describe the parameters and relevant assumptions, as indicated below:

Decision Variables

Due to the economies of scale involved, it is assumed that the decision maker either repairs none of the defects or all the defects of a particular category in that section. Suppose that a section is observed to contain Class II defects of 3 defect categories. In this case, there are $2^3=8$ alternatives available to the decision maker, because s/he can choose to repair none or all of the defects of each type in any possible combination. Decision variables are denoted using indicator variables $x^i_a$. If alternative $a \in A$ is chosen for section $i \in I$, then $x^i_a=1$, otherwise $x^i_a=0$. The decision maker can choose only one of the alternatives for a particular section, and this results in a feasibility constraint:

$$\sum_{a \in A} x^j_a = 1 \forall i \in I.$$

$$= C_D \sum_{i \in I, a \in A} x^j_a P^i_a,$$

where $P^j_a$

Cost and Probability Parameters

After an inspection run by the geometry car, the decision maker must fix all observed Class I defects. The cost of repairing such defects is denoted in section i as $C^i_1$. If the decision maker repairs all of the Class II defects of a certain category in a section, then it is clear that there will be costs associated with repairing these defects. The cost of Class II defect repair:

$$\sum_{i \in I, a \in A} x^j_a C^i_{2,a},$$

where $C_{2,a}^i$
is the cost of repairing all Class II defects for section i if alternative a is chosen.

If Class II defects are not repaired, then there will be costs associated with repairing them at the next inspection run if they turn into Class I defects. Hence similarly, the expected cost of Class I defect repair is:

$$\sum_{i \in I, a \in A} x^j_a C^i_{1,a}$$

$C_{1,a}^i$ is the expected cost of Class I defect repair for section i if alternative a is chosen, and it includes the probability of deterioration of all Class II defects into Class I defects. Specifically, $$C^i_{1,a} = \sum_{j \in J} \sum_{k \in K} p^k_a C^j_{1,a}$$

where the summation is over all defect categories j in section i, and for all defects k in category j. $p^k_a$ is the probability that this defect will progress to a Class I defect if alternative a is chosen ($p_a^k=0$) when defect k is repaired, otherwise $p_a^k=p_k(t)$), and $C^j_{1,a}$ is the cost of fixing a Class I defect of category j when alternative a is chosen. Likewise, there are also costs associated with derailment:

$$\text{Expected cost of derailment} = C_D \sum_{i \in I, a \in A} x^j_a P^i_a,$$

where $P^i_a$ is the probability of derailment in section i if alternative a is chosen, and $D_D$ is the expected derailment cost. A derailment may be defined as the interruption of normal wheel-to-rail interaction, and the consequences of derailments can vary significantly, from slight equipment damage to passenger injury or even death. FIG. 6 presents the derailment cost data and a fitted probability density function. The derailment cost distribution follows a heavy-tailed distribution, ranging from hundreds of US dollars to millions of US dollars.

The formal optimization model may be expressed as follows:

$$\text{Minimize total expected cost} = \sum_{i \in I} \sum_{a \in A} x^j_a (C^i_{2,a} + C^i_{1,a} + C_D P^i_a) + C^i_1 \quad (1a)$$

$$\text{Subject to } x^j_a = \{0, 1\} \forall i \in I, \forall a \in A \quad (1b)$$

$$\sum_{a \in A} x^j_a = 1 \forall i \in I \quad (1c)$$

$$\sum_{i \in I, a \in A} x^j_a C^i_{2,a} \leq B \quad (1d)$$

Objective (1a seeks to minimize the total expected cost, which is the sum of Class I and II defect repair costs in this period, expected Class I defect repair costs in the next period, and expected derailment costs in the intermediate time period.

Equation (1b specifies that the decision variables are binary 0-1 variables.

Equation (1c is for feasibility, indicating that only 1 alternative can be chosen for any particular section.

Inequality equation (1d is a capacity constraint where the total repair cost of Class II defects cannot exceed the available budget. If the budget includes both Class I and Class II defects for the current inspection run, then this constraint can be modified to:

$$\left(\sum_{i \in I, a \in A} x_a^i C_{2,a}^i\right) + C_1^i \leq B.$$

The optimization model is a binary integer programming (BIP problem which is linear in the objective function as well as constraints, and it can be solved using standard commercial solvers.

Note that when the cost of derailment is a random variable, due to the nature of the optimization formulation, one may simply replace derailment cost $C_D$ with the expected derailment cost $\overline{C_D}$ in the optimization model 1(a-(d. This is because the total expected cost is given as:

$$E\left[\sum_{i \in I}\sum_{a \in A} x_a^i(C_{2,a}^i + C_{1,a}^i + C_D P_a^i) + C_1^i\right] = \qquad (2)$$

$$\sum_{i \in I}\sum_{a \in A} E[x_a^i(C_{2,a}^i + C_{1,a}^i + C_D P_a^i) + C_1^i] =$$

$$\sum_{i \in I}\sum_{a \in A} x_a^i(C_{2,a}^i + C_{1,a}^i + E[C_D]P_a^i) + C_1^i =$$

$$\sum_{i \in I}\sum_{a \in A} x_a^i(C_{2,a}^i + C_{1,a}^i + \overline{C_D}P_a^i) + C_1^i$$

since the expectation of a sum is the sum of expectations. According to expression (2, the stochastic objective will eventually be derived the same as deterministic one (1a. Therefore, the proposed BIP can also handle uncertainty derailment costs.

Comparison with Heuristic Strategies

The solution of the optimization formulation may be compared with two "baseline" heuristic strategies that are intuitive and commonly used in practice to make track repair decisions.

Heuristic I: Distance-Based Strategy (HEUI

It is intuitive and cost-efficient to repair a Class II defect that is near a Class I defect of the same category. In the distance-based strategy, Class II defects close to Class I defects in the same category are likely to be repaired. The expression:

$$D_j^i = \min(d_j^{ik}) \forall i, j$$

is defined as the distance index of section i and defect category j, and $d_j^{ik}$ represents the distance to the nearest Class I defect for Class II defect k in section i and category j. Given a budget, section and defect category, the section and category pairs (i,j are ranked and selected for repair in ascending order of the distance index, until the budget is consumed.

Heuristic II: Severity-Based Strategy (HEUII

In the severity-based strategy, an empirical aggregate level measure of defect amplitudes is computed for every section and category. The severity index may be defined as:

$$S_j^i = \exp\left(\frac{\max(\omega_j^{ik})}{\omega_j^{max}}\right) \ln(n_j^i) \forall i, j$$

where $\omega_j^{ik}$ is the amplitude of Class II defect k in section I and category j, $\omega_j^{max}$ denotes the maximum amplitude of geo-defect category j, and $n_j^i$ represents the number of Class II defects in section I and category j. These severity measures are ranked and each section and category pair (i,j is repaired in descending order of severity, until the budget is consumed.

As described above, the geo-defect repair modeling processes provides an analytical framework to address the track geo-defect repair problem using three models. First, a deterioration model is specially designed for track Class II geo-defects, and it is configured to model deterioration rates for each geo-defect category. Second, a track derailment risk model is proposed by applying survival analysis. This model incorporates combinations of effects from different types of geo-defects, and represents how derailment risk changes over time. Finally, an optimization model is formulated for making geo-defect repair decisions. The methodology can yield more reliable and less costly solutions than typical heuristic strategies used according to current industry practices.

The geo-defect repair modeling processes also include a feature that enables geo-defect identification when there is uncertainty of the physical location of the geo-defects within the railroad network. The modeling processes with location uncertainty may be implemented in conjunction with the aforementioned features shown and described in FIGS. 1-9. In particular, the process described in FIG. 3 above may be further expanded as will now be described in FIGS. 10-13 herein. While the processes described in FIGS. 10-13 relate to the railroad industry, it will be understood that the processes may be useful in any industry that manages assets with the issue of collecting, monitoring, or inspecting measurements with location uncertainty.

Figure 10A:
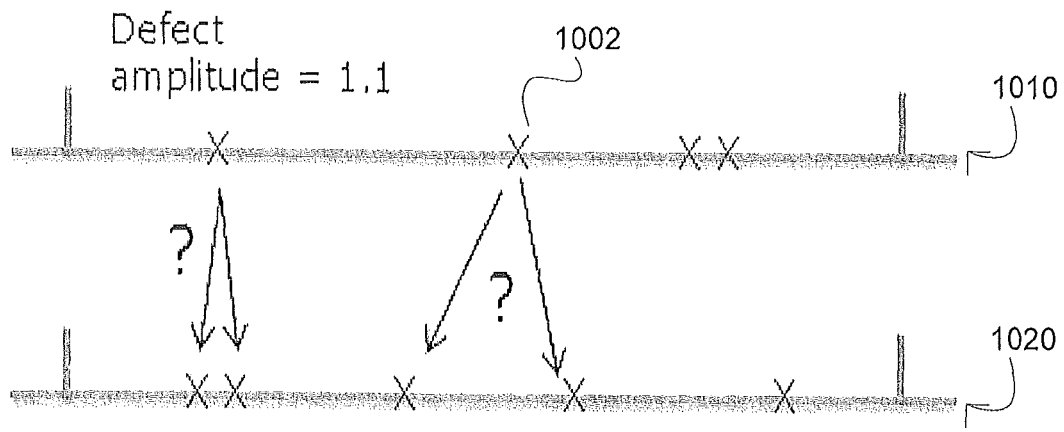
FIGS. 10A-10B illustrate graphical depictions of a portion of a railroad in accordance with an embodiment of the present invention.

Geo-defect location uncertainty can be caused by measurement or operation errors. Location uncertainty indicates a situation whereby an inspector who is evaluating measurements of a defect and its changes over time through inspections, is unsure or unable to determine if an identified defect is in fact the same defect previously determined because the location identifier (e.g., GPS coordinates of those two defects are not identical, e.g., based on some skew in the data collected. For example, as shown in FIG. 10, a portion of a railroad 1000A at two different inspection runs 1010 and 1020, and it is assumed that the inspection run 1020 was conducted at a point in time later than the inspection run 1010. The inspection runs 1010 and 1020 illustrate several geo-defects 'X' 1002 identified at respective physical locations on the railroad portion 1000A. As can be seen in FIG. 10, the defects identified between the inspection runs do not align with one another with respect to their assumed or approximated physical location. The geo-defect repair processes with location uncertainty provide the ability to better assess and correlate geo-defects and their locations from one inspection run to another. It will be understood that the geo-defect repair processes may be implemented via the system 200 described in FIG. 2.

Figure 11:
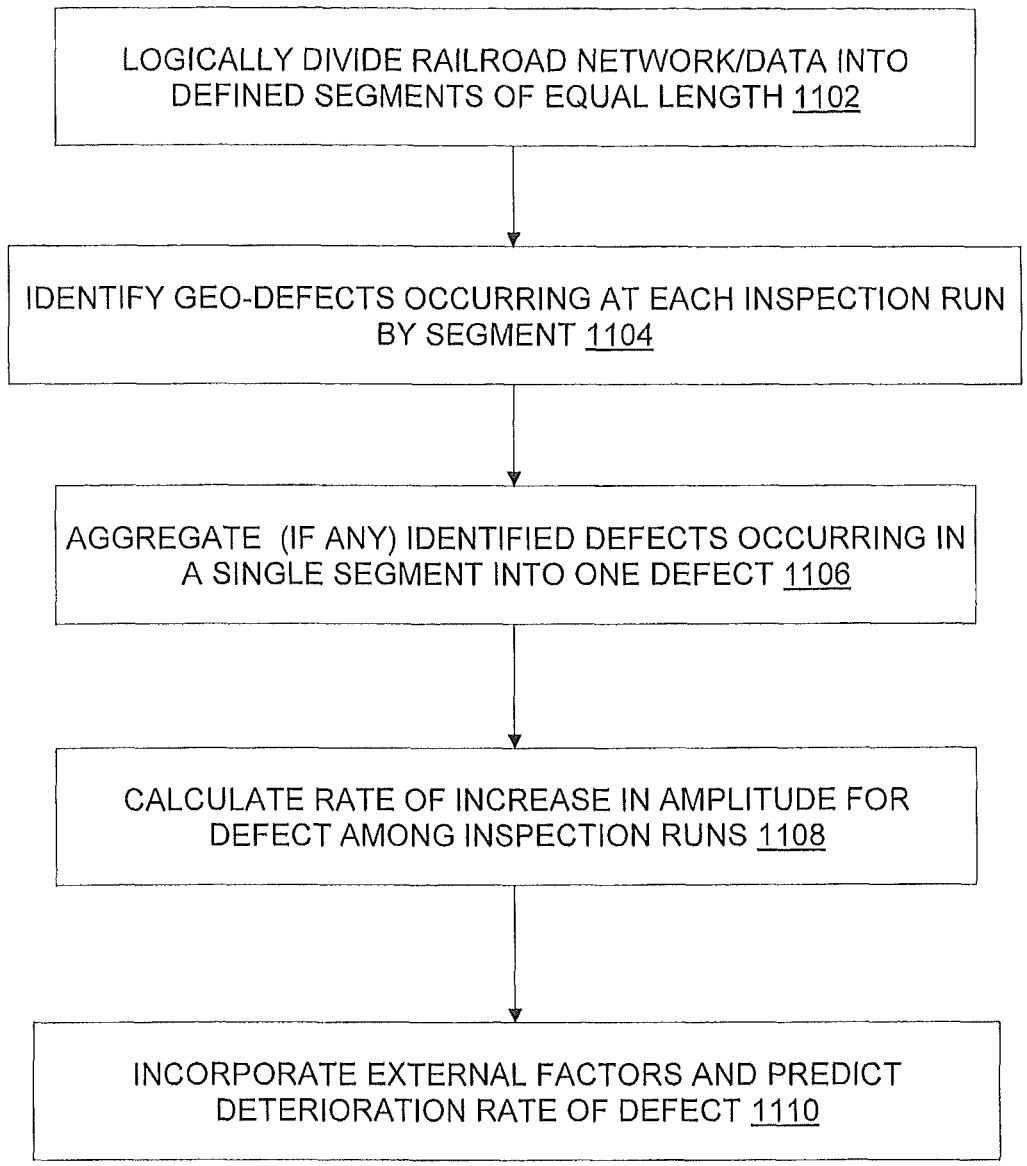
FIG. 11 flow diagram describing a process for implementing geo-defect repair modeling processes with location uncertainty according to an embodiment of the present invention.

Turning now to FIG. 11, a process for implementing the geo-defect repair processes with location uncertainty will now be described in an embodiment. The process of FIG. 11 assumes that inspection data is available for at least two inspection runs conducted over a period of time.

At step 1102, the process logically divides the railroad network and data into defined segments of equal length. In an embodiment, the segments are selected to be of a size which, when geo-defect data is collected, will provide meaningful information to an evaluator of the data. For example, if the segments are too small, there may not be enough data for each segment to provide meaningful information. Likewise, if the segments are too large, there may be too many observations to process and correlation between defects in those large segments will be spurious. In an embodiment, the railroad network may be divided into segments of 0.02 miles in length. In addition, the segments are configured such that there is no overlap between them.

Figure 10B:
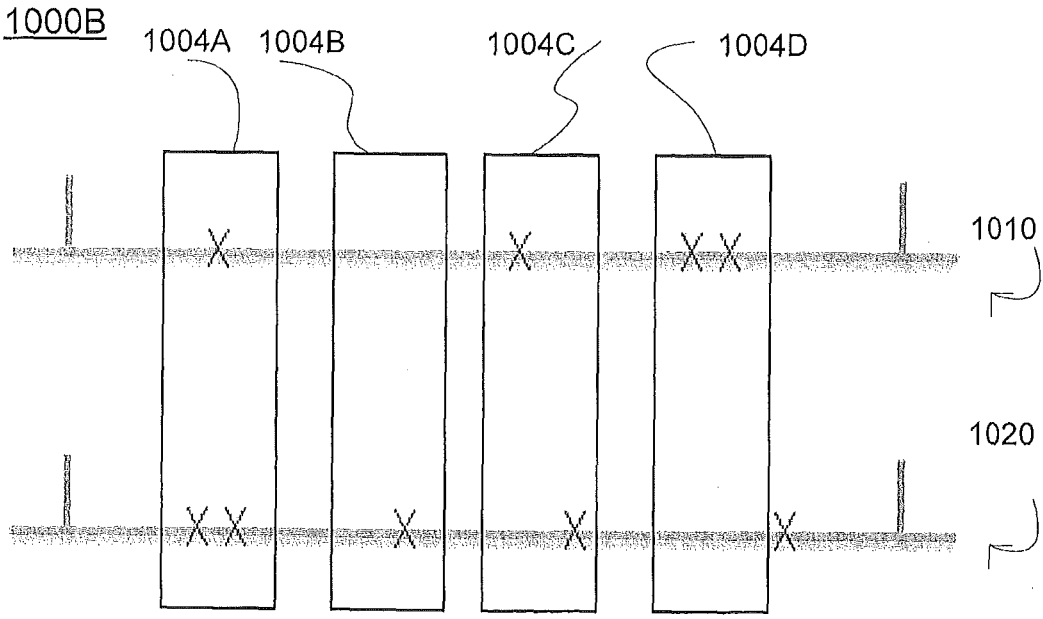

At step 1104, the geo-defects, and their approximated physical locations, for each segment are identified for each inspection run used in the analysis. The process of step 1104 seeks to identify a one-to-one correspondence between defects in a given segment across two or more inspection runs. For example, as shown in FIG. 10B, a portion of a railroad 1000B (corresponding to the railroad portion 1000A is divided into segments 1004A, 1004B, 1004C, and 1004D for illustrative purposes. It can be seen in FIG. 10B that one defect is identified in segment 1004A for inspection run 1010, while two defects are identified in segment 1004A for inspection run 1020. In segment 1004B, it is shown that no defect was found in inspection run 1010 but later appears in the inspection run 1020, which indicates a new geo-defect has developed between the two inspection runs. In segment 1004C, the physical location of the geo-defects are very closely aligned indicating that they are likely to represent the same defect (i.e., though not perfectly correlated with respect to the physical location due to some inspection error assuming the amplitude of the later inspection has stayed the same or has increased. As defects are assumed to worsen over time, a defect that is shown to have decreased between inspection runs is likely to be a different defect from the one determined in the earlier inspection run. In segment 1004D, two defects occurring in inspection run 1010 do not appear in inspection run 1020 indicating that the defects have been repaired.

At step 1106, all defects occurring in a single segment are aggregated into a single defect.

Figure 12:
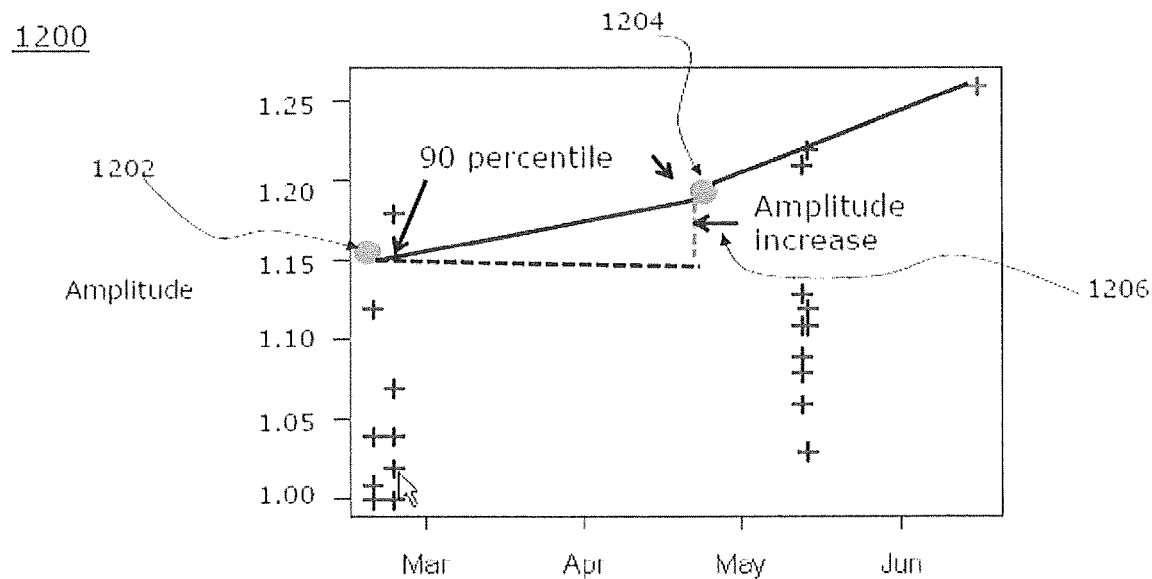
FIG. 12 depicts a chart including sample defect amplitude measurements in accordance with an embodiment of the present invention.

At step 1108, the process calculates the increase (if any in the amplitude of the geo-defects for each segment by comparing the amplitudes of each geo-defect in each inspection run. As shown in FIG. 12, a chart 1200 illustrating the amplitude of defects for a segment over time (e.g., March through June. In particular, a measurement 1202 illustrates the amplitude of a defect in March and another measurement 1204 of the defect in May. The amplitude increase 1206 is shown generally in the chart 1200. The process determines a correlation of the geo-defects between the inspection runs as a function of the approximated locations within corresponding segments.

Figure 13:
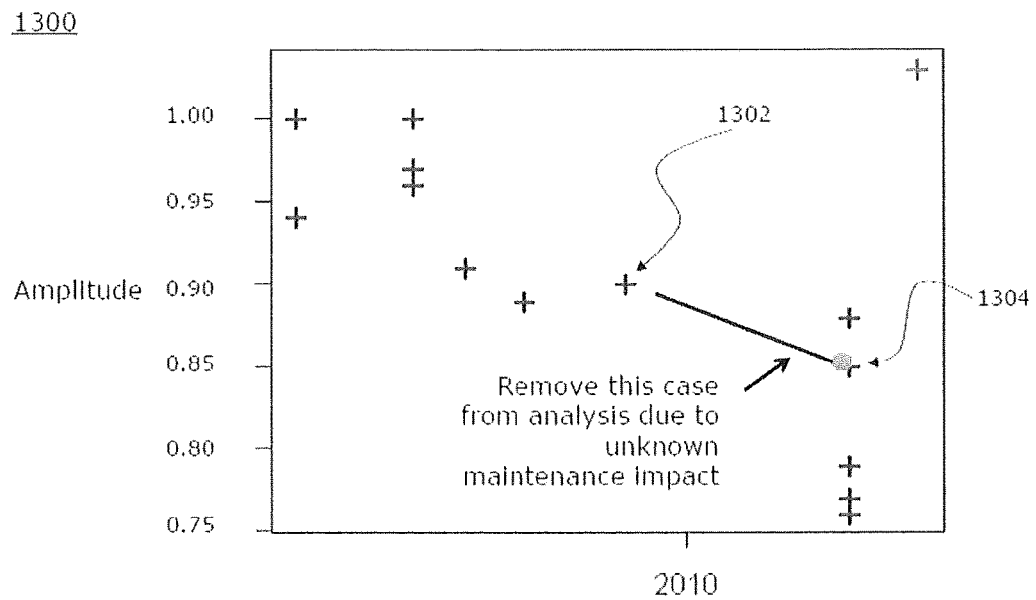
FIG. 13 depicts a chart including amplitude data for determining a deterioration rate of a defect in accordance with an embodiment of the present invention.

At step 1110, any external factors (e.g., traffic that may have an impact on how fast or slow a geo-defect is expected to deteriorate are incorporated into the calculation in determining or predicting a deterioration rate for the defect. The ability to predict the deterioration rate is useful in evaluating repair decisions and their timing. A chart 1300 illustrating a deterioration rate prediction for a defect is shown in FIG. 13. In the chart 1300, certain measurements determined to be insignificant in the analysis may be discarded (e.g., a measurement 1302 is taken at one inspection, and a second measurement 1304 is taken at a later inspection; the later measurement may be removed if it is determined to be statistically insignificant such due to an unknown maintenance impact. Additionally, the prediction process of step 1110 includes processing only the geo-defects having a rate of increase in amplitude at or above a defined threshold value to ensure that only significant geo-defects are considered for repair.

The deterioration rate prediction calculation for each defect may be modeled as follows:

$$\log(\text{amplitude increase}/(\text{time lag} * \text{current amplitude})) =$$
$$a0 + a1 * \text{traffic}(MGT + a2 * \text{traffic}(\# \text{ of cars}) + a3 * \text{traffic} (\# \text{ of trains} +$$
$$a4 * \text{time duration since last red tag} + a5 * \text{traffic speed}$$

A formula used in the model may include:

$$\log\left(\frac{y(t+\Delta t) - y(t)}{\Delta t * y(t)}\right) = X\alpha \frac{y(t+\Delta t) - y(t)}{\Delta t} = y(t) * e^{X\alpha}$$

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc. or an embodiment combining software and hardware aspects that may all generally be referred to herein as a "circuit," "module" or "system." Furthermore, aspects of the present invention may take the form of a computer program product embodied in one or more computer readable medium(s having computer readable program code embodied thereon.

Any combination of one or more computer readable medium(s may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list of the computer readable storage medium would include the following: an electrical connection having one or more wires, a portable computer diskette, a hard disk, a random access memory (RAM, a read-only memory (ROM, an erasable programmable read-only memory (EPROM or Flash memory, an optical fiber, a portable compact disc read-only memory (CD-ROM, an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN or a wide area network (WAN, or the connection may be made to an external computer (for example, through the Internet using an Internet Service Provider.

Aspects of the present invention are described below with reference to flowchart illustrations and/or block diagrams of methods, apparatus (systems and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The invention claimed is:

1. A method, comprising:
    logically dividing a railroad network into segments each of a specified length, the railroad network comprising a railroad network infrastructure that includes a plurality of data sources, the plurality of data sources comprising sensors configured to monitor operational aspects of components of the railroad network;
    collecting data from the plurality of data sources with respect to monitored operational aspects of the components;
    identifying, via a computer processor that is communicatively coupled to the plurality of data sources, geo-defects and approximated locations of the geo-defects occurring at each inspection run for each of the segments;
    resolving location uncertainty of the approximated locations of each of the geodefects based on geo-defect type, geo-defect amplitude, and location proximity for corresponding geo-defects assessed at each inspection run, wherein the corresponding geo-defects are determined by matching identified geo-defects from multiple inspection runs within each segment of a specified length;

calculating, via the computer processor, a rate of increase in amplitude of each of the geo-defects for each of the segments between inspection runs;

predicting a deterioration rate for each of the geo-defects based on the calculating;

upon determining multiple geo-defects exist for one of the segments at one of the inspection runs and at least one geo-defect exists for the one of the segments at another of the inspection runs, aggregating the multiple geo-defects to reflect the single geo-defect;

determining an instantaneous rate of failure probability, the determining of the instantons rate of failure probability comprising for each of the segments:

calculating a likelihood of the derailment occurring at a time t;

calculating a likelihood that the segment will survive until time t; and calculating the instantaneous rate of failure probability at time t given that the derailment has not occurred until at least time t by dividing the likelihood of the derailment occurring at time t by the likelihood that the segment will survive until time t;

generating a repair decision for each of the geo-defects based on one or more of the predicting, the calculated likelihood of derailment, or the determined instantaneous rate of failure probability; and selectively repairing one or more of the geo-defects based on the repair decision.

2. The method of claim 1, wherein the segments of the railroad network are of equal length.

3. The method of claim 1, wherein the segments do not overlap.

4. The method of claim 1, wherein the predicting includes processing only the geo-defects having a rate of increase in amplitude at a defined threshold value resulting from the calculating.

5. The method of claim 1, wherein a geo-defect identified at a current inspection run is determined to be the same geo-defect as a geo-defect identified at a previous inspection run, despite the geo-defect of the current inspection run being documented as residing at a location that is different than a location of the geo-defect of the previous inspection run, when the geo-defect of the current inspection run:
is determined to have a common geo-defect type as the geo-defect type of the geo-defect identified for the previous inspection run;
has an equal or greater amplitude than the geo-defect of the previous inspection run; and
has a location proximity within a predetermined distance of the geo-defect of the previous inspection run.

6. The method of claim 1, wherein the sensors are configured to measure qualitative aspects of the components of the railroad network and ambient conditions, the components including tracks and cars.

7. The method of claim 6, wherein the sensors include at least one of:
machine vision detectors (MVDs);
wheel impact load detectors (WILDs);
optical geometry detectors (OCDs);
truck performance detectors (TPDs);
acoustic bay detectors (ABDs);
hot box detectors;
warm bearing detectors; and
hot wheel/cold wheel detectors.

8. The method of claim 1, wherein the geo-defect types include at least two of: align;
cant;
dip;
gauge;
harmonic cross-level;
over-elevation;
reverse cross-level;
super cross-level elevation;
surf;
twist;
warp; and
wear.

9. A computer program product comprising a computer-readable storage medium having program code embodied thereon, which when executed by a computer processor, causes the computer processor to implement a method, the method comprising:

logically dividing a railroad network into segments each of a specified length, the railroad network comprising a railroad network infrastructure that includes a plurality of data sources, the plurality of data sources comprising sensors configured to monitor operational aspects of components of the railroad network;

collecting data from the plurality of data sources with respect to monitored operational aspects of the components;

identifying geo-defects and approximated locations of the geo-defects occurring at each inspection run for each of the segments;

resolving location uncertainty of the approximated locations of each of the geodefects based on geo-defect type, geo-defect amplitude, and location proximity for corresponding geo-defects assessed at each inspection run, wherein the corresponding geo-defects are determined by matching identified geo-defects from multiple inspection runs within each segment of a specified length;

calculating a rate of increase in amplitude of each of the geo-defects for each of the segments between inspection runs; and predicting a deterioration rate for each of the geo-defects based on the calculating;

upon determining multiple geo-defects exist for one of the segments at one of the inspection runs and at least one geo-defect exists for the one of the segments at another of the inspection runs, aggregating the multiple geo-defects to reflect the single geo-defect;

determining an instantaneous rate of failure probability, the determining of the instantons rate of failure probability comprising for each of the segments:

calculating a likelihood of the derailment occurring at a time t;

calculating a likelihood that the segment will survive until time t; and calculating the instantaneous rate of failure probability at time t given that the derailment has not occurred until at least time t by dividing the likelihood of the derailment occurring at time t by the likelihood that the segment will survive until time t;

generating a repair decision for each of the geo-defects based on one or more of the predicting, the calculated likelihood of derailment, or the determined instantaneous rate of failure probability; and selectively repairing one or more of the geo-defects based on the repair decision.

10. The computer program product of claim 9, wherein the segments of the railroad network are of equal length.

11. The computer program product of claim 9, wherein the segments do not overlap.

12. The computer program product of claim 9, wherein the predicting includes processing only the geo-defects having a rate of increase in amplitude at a defined threshold value resulting from the calculating.

13. The computer program product of claim 9, wherein a geo-defect identified at a current inspection run is determined to be the same geo-defect as a geo-defect identified at a previous inspection run, despite the geo-defect of the current inspection run being documented as residing at a location that is different than a location of the geo-defect of the previous inspection run, when the geo-defect of the current inspection run:
- is determined to have a common geo-defect type as the geo-defect type of the geo-defect identified for the previous inspection run;
- has an equal or greater amplitude than the geo-defect of the previous inspection run; and
- has a location proximity within a predetermined distance of the geo-defect of the previous inspection run.

14. The computer program product of claim 9, wherein the sensors are configured to measure qualitative aspects of the components of the railroad network and ambient conditions, the components including tracks and cars.

15. The computer program product of claim 14, wherein the sensors include at least one of:
- machine vision detectors (MVDs);
- wheel impact load detectors (WILDs);
- optical geometry detectors (OCDs);
- truck performance detectors (TPDs);
- acoustic bay detectors (ABDs);
- hot box detectors;
- warm bearing detectors; and
- hot wheel/cold wheel detectors.

16. The computer program product of claim 9, wherein the geo-defect types include at least two of:
- align;
- cant;
- dip;
- gauge;
- harmonic cross-level;
- over-elevation;
- reverse cross-level;
- super cross-level elevation;
- surf;
- twist;
- warp; and
- wear.

* * * * *